US012805071B2

(12) United States Patent
Wang et al.

(10) Patent No.: US 12,805,071 B2
(45) Date of Patent: Nov. 17, 2026

(54) MANUFACTURING METHOD FOR RGB InGaN-BASED MICRO LED, AND DEVICE MANUFACTURED THEREBY

(71) Applicant: Hsiao Lei Wang, Taoyuan City (CN)

(72) Inventors: Hsiao Lei Wang, Taoyuan City (CN); Neng Tai Shih, New Taipei City (CN); Kao Mei Sung, Taoyuan City (CN)

(73) Assignee: Hsiao Lei Wang, Taoyuan City (TW)

( * ) Notice: Subject to any disclaimer, the term of this patent is extended or adjusted under 35 U.S.C. 154(b) by 354 days.

(21) Appl. No.: 18/682,947

(22) PCT Filed: Aug. 3, 2022

(86) PCT No.: PCT/CN2022/109902
§ 371 (c)(1),
(2) Date: Feb. 12, 2024

(87) PCT Pub. No.: WO2023/016308
PCT Pub. Date: Feb. 16, 2023

(65) Prior Publication Data

US 2025/0234683 A1 Jul. 17, 2025

(30) Foreign Application Priority Data

Aug. 12, 2021 (CN) ......................... 202110924887.3

(51) Int. Cl.
*H10H 20/825* (2025.01)
*H10H 20/01* (2025.01)
*H10W 90/00* (2026.01)

(52) U.S. Cl.
CPC .... *H10H 20/825* (2025.01); *H10H 20/01335* (2025.01); *H10W 90/00* (2026.01)

(58) Field of Classification Search
CPC ........... H10H 20/825; H10H 20/01335; H10H 20/018; H10H 20/80; H10H 29/10; H10H 29/142; H10W 90/00
See application file for complete search history.

(56) References Cited

FOREIGN PATENT DOCUMENTS

| | | |
|---|---|---|
| CN | 107833878 A | 3/2018 |
| CN | 107994047 A | 5/2018 |
| CN | 110010729 A | 7/2019 |
| CN | 111009602 A | 4/2020 |
| CN | 112331747 A | 2/2021 |
| CN | 113644168 A | 11/2021 |

OTHER PUBLICATIONS

International Search Report of PCT/CN2022/109902 mailed Oct. 26, 2022, 5 pages.
Written Opinion of PCT/CN2022/109902 mailed Oct. 26, 2022, 4 pages.

*Primary Examiner* — David Vu
(74) *Attorney, Agent, or Firm* — COOPER LEGAL GROUP LLC

(57) ABSTRACT

Embodiments provide a method for fabricating an RGB InGaN-based micro-LED, with the following steps: pretreating an epitaxial wafer material; depositing isolation layers on the epitaxial wafer; removing the isolation layers of the LED epitaxial zone corresponding to two or three color light components on the same epitaxial wafer, making the block trench zones, and growing intermediate layers at the bottom of the block trench zones corresponding to at least one or two components for modulating the epitaxial lattice constant, and carrying out the LED epitaxial process in the block trench zones. Embodiments also provide a device fabricated therefrom.

15 Claims, 4 Drawing Sheets

MANUFACTURING METHOD FOR RGB InGaN-BASED MICRO LED, AND DEVICE MANUFACTURED THEREBY

TECHNICAL FIELD

The present disclosure relates to a method for fabricating RGB InGaN-based micro-LEDs on the same wafer and a device fabricated therefrom.

BACKGROUND

With the progress of the times, displays have become lighter, thinner, and more power-saving, and the mainstream technology of displays has gradually changed from Cathode Ray Tube (CRT) displays and LCDs to the emerging OLED displays. micro-LED displays, which have been actively invested in by various countries recently, have superior characteristics and feasibility, and are expected to become the mainstream technology for next-generation displays under the leadership of international leading manufacturers and the active participation of the industry. micro-LED technology shrinks the traditional LED size from the millimeter ($10^{-3}$m) scale to below 100 micrometers ($10^{-6}$m), constituting only 1% of the original LED volume. Through mass transfer technology, micro-scale RGB three-color micro-LEDs grown on epitaxial substrates (also known as native substrates or homoepitaxial substrates) are transferred to the display substrate (or target substrate). By arranging RGB pixels in a matrix and controlling their brightness through addressing, full-colorization is achieved, forming a micro-LED display.

Micro-LED has superior characteristics compared to LCD and OLED. It can be explained from the structure first, LCD due to its own non-self-emitting, need a backlight module as a light source, and liquid crystal molecules need to be polarizer and color filter collocation, as means to control the brightness of the light polarization and color, so it has a more complex and heavy structure. OLED has pixel self-emitting characteristics, such that the backlight module of TFT LCD can be eliminated. However, its organic light-emitting materials are sensitive to moisture, so it is necessary to form a sealed structure of the upper and lower substrate to enhance its weather resistance to the environment. micro-LED uses inorganic LED as pixels and does not have the encapsulation issues of OLED. Consequently, the structure of micro-LED is the simplest, resulting in the thinnest and lightest form. In contrast to traditional LEDs serving as the backlight source in TFT LCD displays, in a micro-LED display, micro-LED serves directly as the emitting pixels. From a characteristic standpoint, micro-LED features self-emission, low power consumption, fast response time, high brightness, ultra-high contrast, wide color gamut, wide viewing angles, ultra-thin form factor, long lifespan, and adaptability to various working temperatures. The technological specifications of micro-LED offer overwhelming advantages compared to LCD and OLED.

As mentioned in the previous, after the completion of the epitaxial process, the micro-LED transfer process must be carried out to transfer millions of micron-grade micro-LEDs to the display substrate, known as the mass transfer technology. If the transfer process can not be efficiently completed in a reasonable period of time, it will not be able to mass-produce. The number of single transfers and the high degree of precision required for picking and placing have not been seen in the current mass-production technology, therefore, the first key challenge facing the development of micro-LED display is the mass transfer, with the goal of transferring millions to tens of millions of micron-rated micro-LEDs from the epitaxial substrate to the display substrate in a reasonable amount of time with precision and accuracy. The development of novel transfer technology is unfamiliar and difficult to the existing LED or LCD industry, and the transfer technology and epitaxial, repair, equipment patents are quite relevant. To some extent, different transfer technologies are matched with corresponding epitaxial, repair, and equipment technologies, making transfer technology a key element in the development of micro-LED display technology. The manufacture of micron-level micro-LED using mass transfer technology, including mass transfer and the corresponding detection and repair processes, presents complexity and challenges. This not only represents the difficulty of technological development but also a primary factor contributing to the need for improvement in manufacturing costs. Overcoming existing obstacles in technology to achieve the manufacture of RGB three-LED components or at least two of them on the same epitaxial substrate and layout them according to the requirements of the final product will effectively bypass or simplify the mass transfer process.

In the manufacturing process of Micro-LED displays, it is necessary to use red, green, and blue (RGB) light-emitting diodes to form the pixels of a unit. Currently, the main manufacturing technologies require the combined use of nitride-based and phosphide-based light-emitting diodes to meet the requirements of the three primary colors. When different material systems of light-emitting diodes are mixed, the different heating and decay characteristics directly affect the quality of image presentation. Different electrical driving characteristics directly lead to complexity in the design of display module driving. Therefore, achieving direct emission RGB (red, green, blue) light-emitting diodes within the same material system is beneficial for solving the above-mentioned problems. Additionally, it will reduce the complexity of the process and the energy loss caused by conversion, thus benefiting the development of micro-LED technology. Indium gallium nitride ($In_xGa_{1-x}N$) epitaxial material is one of the current main material systems used for manufacturing blue light-emitting diodes. In theory, the coverage of the entire visible light emission range can be controlled by adjusting the indium gallium solid solution ratio. Indium gallium nitride benefits from its direct energy gap characteristics and is expected to have better light-emitting efficiency, especially in the realm of blue light mass production technology. Therefore, it has received more attention than other material systems. Its potential is significant in producing direct red, green, and blue light-emitting diodes (RGB direct LED) with approximately controlled conditions and good efficiency. However, currently, green and red light-emitting diodes based on $In_xGa_{1-x}N$ epitaxial materials face technological bottlenecks. Achieving the appropriate emission wavelengths for green and red light requires an increase in the indium content ratio in the $In_xGa_{1-x}N$ epitaxy. In the epitaxial manufacturing process, methods to increase the indium content, such as lowering the epitaxial temperature, are necessary to reach the suitable emission wavelengths. However, this approach faces obstacles such as non-compliance of epitaxial quality with application specifications.

In light of this, in 2017, the French company Soitec announced the development of a substrate material suitable for the above purpose. In the same year, it released a direct green LED successfully manufactured using this substrate. The company's released substrate has a maximum lattice constant of 0.3205 nanometers (nm), with the surface layer being a stress-relieved $In_xGa_{1-x}N$ layer. In 2018, the company also released a successfully manufactured direct red LED. The maximum value of the substrate's lattice constant released by the company remained unchanged at 0.3205 nm. The development of the company's substrate has achieved specific results. However, the complex and intricate manufacturing process of this substrate technology and the resulting high manufacturing costs may hinder its widespread adoption in the market.

The results also prove that the lattice constant of the substrate is one of the key factors in the successful realization of direct green/red $In_xGa_{1-x}N$ LED, that is, the majority of research mentions the influence of the lattice pulling effect. When epitaxially growing $In_xGa_{1-x}N$, as the lattice constant of the substrate or lower layer increases toward the InN end, the indium content ratio in the epitaxial layer is increased. Utilizing this effect, it is possible to maintain the same indium content in the $In_xGa_{1-x}N$ epitaxial layer while increasing the epitaxial temperature to improve the crystalline quality and light-emitting efficiency of the epitaxial layer.

Therefore, the present inventors have developed CN201910240892.5 "RGB Full Color InGaN-based LED and Method for preparing same", which adopts a 2D layered material to cover the surface of the substrate material as the intermediate layer of the $In_xGa_{1-x}N$ epitaxialization, and carries out the application of the van der Waals Epitaxy or Quasi van der Waals Epitaxy technology, such that the stress or strain from the lattice and thermal expansion mismatch in the epitaxial process can be relieved to a certain extent, and the currently available substrate surface can achieve a certain degree of relief from stress or strain. The application of van der Waals Epitaxy or Quasi van der Waals Epitaxy technology enables the stress or strain from the lattice and thermal expansion mismatch in the epitaxial process to be relieved to a certain extent, and realizes high-quality, high-content of $In_xGa_{1-x}N$ epitaxy on currently available substrate surfaces as well as high-efficiency direct green/red LEDs. When the outermost layer of 2D layered materials adopts $MoSe_2$ or $WSe_2$, the lattice constants can reach 0.3283 nm or 0.3297 nm, providing a completely matched epitaxial layer within the red light emission range. This ensures the quality of the epitaxial layer and presents an opportunity to simplify the epitaxial and component processes. The light-emitting diode, from the n-side and multiple quantum wells (MQW) to the p-side, can all be composed entirely of $In_xGa_{1-x}N$ epitaxial layers, making it possible to achieve high-quality direct green/red light-emitting diodes. Furthermore, it is possible to further cover the surface of 2D layered materials with a layer of nitride containing Al, In, or Ga with precisely adjusted lattice constants as the top layer of the intermediate layer for epitaxy. This not only enhances the nucleation of $In_xGa_{1-x}N$ epitaxy but also adds a parameter for adjusting the epitaxial process. This can effectively adjust the temperature required for the $In_xGa_{1-x}N$ epitaxial process and make it possible for the epitaxial process temperatures for blue, green, and red InGaN light-emitting diodes to be the same.

The inventor's continued research has revealed that, based on the previous technology application, reducing the epitaxial layer structure and processes effectively reduces the thermal budget. This will increase the feasibility of sequentially completing the epitaxial processes for two or three InGaN LED components on the same epitaxial wafer. By utilizing mature integrated circuit processes, zone selection can be carried out on a single epitaxial wafer, including the necessary 2D and nitride lattice-modifying layers and epitaxial processes that may be required. According to the temperature requirements of the epitaxial processes, these can be carried out sequentially from high to low temperatures, and after the epitaxial processes are completed, the remaining common component processes can be executed simultaneously. Similarly, based on the previous technology application, when different components achieve uniform epitaxial process temperatures through 2D and nitride lattice-modifying layers, it becomes possible to simultaneously complete the epitaxial processes for two or three InGaN LED components on the same epitaxial wafer. By employing mature integrated circuit processes, zone selection is first carried out on a single epitaxial wafer, followed by the completion of the necessary 2D and nitride lattice-modifying layer processes, and then simultaneous execution of the epitaxial processes and the processes required for the remaining components. This approach will effectively reduce the massive transfer processes.

In accordance with current micro-LED technology practices, the area occupied by the light-emitting components in a micro-LED device may be far less than 50%. Therefore, there is ample space in the planar layout to accommodate modules such as touch control or sensors. Thus, under the premise of the feasibility of producing two or three InGaN LED components on the same epitaxial wafer, the introduction of redundancy repair concepts commonly used in dynamic random access memory (DRAM) for light-emitting components will also become feasible and significantly reduce the complexity and cost of subsequent repair processes and effectively improve the yield. In practice, multiple components are manufactured in the RGB selection zone of each pixel, and a repair circuit design is incorporated into the control circuit, which is executed during the detection and repair phase. This will enable the micro-LED manufacturing process to move towards integration with integrated circuits and also make it possible to more efficiently integrate control circuit components with touch control or sensor modules.

The existing process, as shown in FIG. 1, involves the separate production of blue, green, and red micro-LED chips, the detachment of a large number of these chips from the epitaxial wafer, and their massive transfer to a display substrate through picking and placing processes. Subsequently, testing and repair processes are carried out for the micro-LED chips.

SUMMARY

An object of the present disclosure is to provide a method for fabricating an RGB InGaN-based micro-LED on the same wafer, and to provide a corresponding device fabricated therefrom.

In order to accomplish the above, the solutions of the present disclosure are:

A method for fabricating an RGB InGaN-based micro-LED, used to fabricate a micro-LED device consisting of plural RGB InGaN LED components, where two or three color light components of the RGB InGaN LED components are fabricated on a same epitaxial wafer and are distributed according to a layout design required for a finished product, the method comprises steps of:

S1, polishing an epitaxial wafer material to an epitaxial growth grade and subjecting to an appropriate pretreatment for preparing for subsequent fabrication procedures;

S2, depositing $SiO_2$ or other oxides or nitrides or carbides having electrical insulation, visible light penetration and amorphous structure on the epitaxial wafer as an isolation layer of an epitaxial zone of a light component of each color;

S3, etching, removing the isolation layer of an LED epitaxial zone corresponding to two or three color light components on the same epitaxial wafer, to form block trench zones; and S4, selecting by zone, growing the corresponding intermediate layers on the bottoms of the block trench zones for at least one or two components to modulate an epitaxial lattice constant;

where the intermediate layer is composed of a single type of 2D material, or a composite layer of multiple types of 2D materials; or the intermediate layer consists of a bottom layer and a top layer; the bottom layer is composed of the single type of 2D material or is the composite layer of multiple types of 2D materials, and the top layer is coated onto the bottom layer, consisting of a nitride containing Al, Ga, or In elements;

S5, carrying out an LED epitaxy process in the block trench zone.

Prior to S2, a 2D material underlayer is grown with an existing manufacturing process. The 2D material underlayer includes a heterostructure layer or monolayer of heterogeneous materials, with a total thickness ranging from 0.5 nm to 1000 nm. The 2D materials may consist of hBN (hexagonal boron nitride), graphene, and the TMD family (transition metal dichalcogenides), or the like. Existing processes can be utilized, including growth, deposition, transfer, coating, etc., as well as relevant necessary pre-treatment and post-processing steps. The 2D material underlayer is applied from outside the effective component usage range at the edge of the epitaxial wafer through bevel coating or backside coating.

In S4, the 2D material of the intermediate layer of a selective zone growth adopts a one-step growth process or a one-step deposition process (such as CVD or MOCVD, etc.) or a two-step growth, for example, depositing a tungsten or molybdenum metal layer first and then sulfiding or selenizing this layer.

In S4, a nitride top layer of a selectively grown intermediate layer can be deposited using various physical or chemical vapor deposition processes such as MOCVD, sputtering, or molecular beam epitaxy (MBE), with a thickness controlled to be around 20 nm but is not limited thereto.

In S5, the epitaxial processes of different color light components can be carried out simultaneously or sequentially.

The size of the InGaN LED components produced on the same epitaxial wafer falls within the micro-LED size range.

In the layout design, pixels are formed by RGB InGaN LED components, and more than one set of RGB InGaN LED components in a single pixel of RGB InGaN LED component in the layout design is used as redundancies.

In the layout design, pixels are formed by RGB InGaN LED components. This layout design can reserve sufficient space to accommodate the potential configuration of touch components, or various biometric identification components that may be required for the display.

After S5, detaching the epitaxial wafer and then coupling to a driver and a control circuit, or detaching the epitaxial wafer directly coupling to a substrate on which the driver and the control circuit and the like are prepared.

After S5, carrying out process of integrating a TFT and other arrays on a same epitaxial wafer directly on the same epitaxial wafer; after the process completed, the epitaxial wafer is detached and then connected with the substrate containing necessary mechanisms (the drivers and control circuit etc.), or directly coupled to the substrate containing the necessary mechanisms, and detached from the epitaxial wafer.

The driver and control circuit design includes redundancy as well as mechanisms, such as electronic fuses (e.g., e-fuse and the like), for testing and repairing the RGB LED components.

An RGB InGaN-based micro-LED device, consisting of plural RGB InGaN LED components, and distributed in accordance with a layout design required for a finished product, wherein two or three color light components in the RGB InGaN LED components are formed on a same epitaxial wafer; the epitaxial wafer is formed with an isolation layer of an epitaxial zone, and the isolation layer of the epitaxial zone is formed with block trench zones of two or three color light components, and accordingly, bottoms of the block trench zones of at least one or two color light components form an intermediate layer for modulating an epitaxial lattice constant, and then the block trench zones form an epitaxial layer of InGaN-based material corresponding to a color light component.

The intermediate layer is composed of a single type of 2D material, or is a composite layer composed of plural types of 2D materials.

Alternatively, the intermediate layer comprises a bottom layer and a top layer, the bottom layer comprises the single type of 2D material or comprises the plural types of 2D materials to form a composite layer; the top layer is coated on the bottom layer, the top layer is composed of nitride containing Al or Ga or In elements; a nitride top layer of the intermediate layer is controlled to have a thickness of around 20 nm.

The epitaxial wafer uses materials such as sapphire, silicon, silicon carbide, or other materials suitable for the conditions of the InGaN epitaxial process.

A fully coated 2D material underlayer is further provided between the epitaxial wafer and the isolation layer of the epitaxial zone, and a bottom of the block zone is provided above the 2D material underlayer.

The thickness the 2D material underlayer ranges from 0.5 nm to 1000 nm.

The 2D material underlayer is applied from outside an effective component usage range at an edge of the epitaxial wafer through bevel coating or backside coating.

The 2D materials include hBN (hexagonal boron nitride), graphene, and the TMD family (transition metal dichalcogenides), and the like.

The epitaxial wafer is formed with the block trench zones of three color light components on the isolation layer of the epitaxial zone, the bottoms of the block trench zones of the three color light components are formed with the intermediate layer used for modulating the epitaxial lattice constant; the intermediate layer at the bottom of the block trench zone layer of a blue light component consists of a $WSe_2$ layer and a GaN layer, the intermediate layer at the bottom of the block trench zone layer of a green light component is composed of a $WSe_2$ layer and an $In_xGa_{1-x}N$ layer, and the intermediate layer at the bottom of the block trench zone layer of a red light component is composed of a $WSe_2$ layer and an $In_yGa_{1-y}N$ layer, where $y>x$.

By implementing the above approach, the present disclosure achieves consistent temperature and other parameters for the epitaxial processes of different color light components through the modulation of the 2D material and the nitride lattice. This enables the sequential or simultaneous completion of the epitaxial processes for two or three types of InGaN LED components on the same epitaxial wafer, along with the completion of processes required for other components, resulting in significant reduction in mass transfer processes. With redundancy repair designs incorporated into the light-emitting components, the complexity and cost of subsequent repair processes are greatly reduced, effectively improving the yield of high-quality products.

NOTE OF REFERENCE SIGNS

Figure 1:
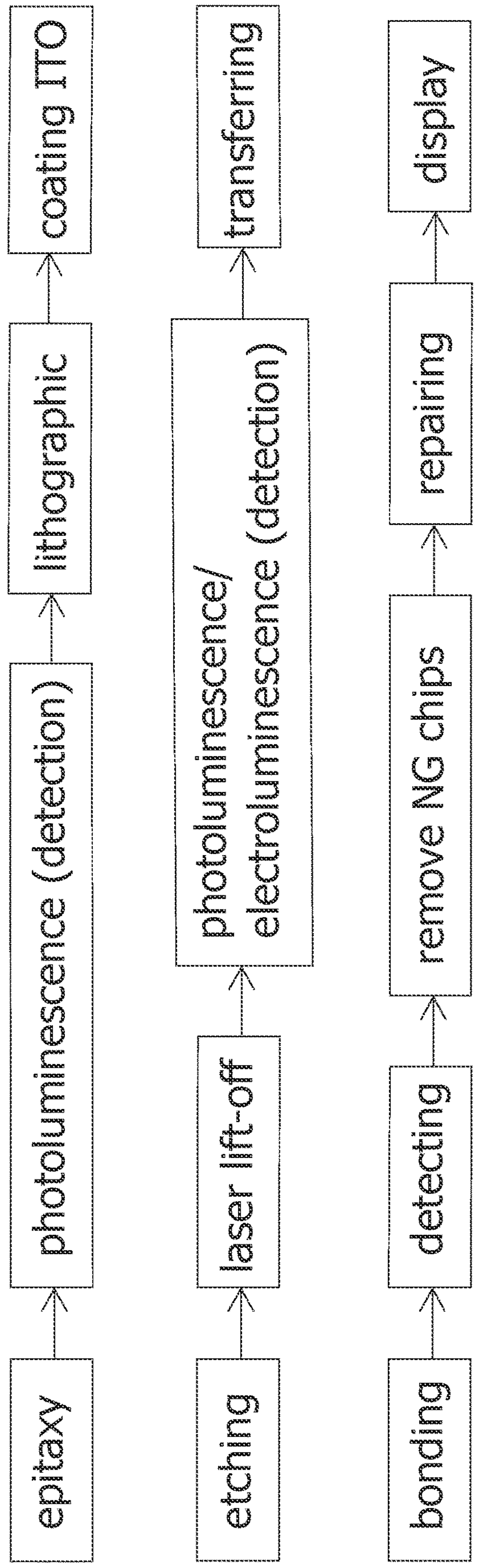
FIG. 1 is a diagram of the process in the prior art.

1, Epitaxial wafer;
2, 2D material underlayer;
3, isolation layer;
31, block trench zone;
(41, 42, 43), Intermediate layer;
5, Epitaxial layer;
6, Electrode;
7, Metal pad;
8, Driver and Control Circuit;
9, Baseboard.

DESCRIPTION OF EMBODIMENTS

The present disclosure is described in further detail below in connection with the figures and specific embodiments.

The present disclosure provides a method for fabricating an RGB InGaN-based micro-LED, used for fabricating a micro-LED device comprising plural RGB InGaN LED components by completing the components fabrication on the same epitaxial wafer with two or three color light components of the three components of the RGB InGaN LEDs thereof, and distributing them according to the layout design required for the finished product.

Referring to FIGS. 2 to 5, they illustrate the examples of producing red, green, and blue LED components on the same wafer, to explain the manufacturing process according to the present disclosure.

Step 1: polishing the materials of epitaxial wafer 1 (sapphire wafer)'s epitaxial growth grade, to meet the polishing requirements of the epitaxial growth grade, serving as the starting material for subsequent manufacturing processes;

The epitaxial wafer 1 uses sapphire, silicon, silicon carbide, or other materials suitable for the conditions of the InGaN epitaxial process.

Additionally, a 2D material underlayer 2 may be added as per design requirements, for example, hexagonal boron nitride (hBN), using existing manufacturing processes for the growth of the 2D material underlayer 2. Specifically, the surface of the epitaxial wafer 1 can be entirely coated with a 2D material underlayer 2, which acts as an etch stop layer for the subsequent selective RGB epitaxial process, a substrate for selective 2D material growth, and a van der Waals bond layer for detachment of the LED components from the epitaxial wafer 1 after the LED process.

The 2D material underlayer 2 includes a heterostructure layer or a monolayer, with a total thickness ranging from 0.5 nm to 1000 nm. The 2D materials can include hBN (hexagonal boron nitride), graphene, and the TMD family (transition metal dichalcogenides). Existing processes such as growth, deposition, transfer, coating, as well as necessary pre-treatments and post-treatments can be employed. When the surface of the epitaxial wafer 1 is fully coated with the 2D material underlayer 2 during the epitaxial component process, the 2D material underlayer is applied from outside an effective component usage range at an edge of the epitaxial wafer through bevel coating or backside coating, intending to effectively coat the side edge of the 2D material underlayer 2, thus avoiding the risk of partial or complete detachment during the component process. After the component process is completed, bevel etching is carried out to remove this protective layer, followed by the detachment of the epitaxial wafer. The material of the protective layer can be an oxide or nitride.

Step 2: depositing $SiO_2$ on the epitaxial wafer as the epitaxial isolation layer 3 of the epitaxial zone for each color light component. Instead of $SiO_2$, other materials, such as oxide, nitride, or carbide with electrical insulation, visible light transmission, and amorphous structure can also be used.

Step 3: etching using yellow light; removing the $SiO_2$ on the isolation layer of the LED epitaxial zone corresponding to each color light component from the same epitaxial wafer 1; stopping etching at the 2D material underlayer 2 (hBN surface), creating three sets of block trench zones 31 for making the three-color components. If no aforementioned 2D material underlayer 2 is presented, the etching stops on the epitaxial wafer 1.

Step 4: selecting a zone, means selecting at least (n−1) block trench zones 31 of the n block trench zones 31 in Step 3 to grow an intermediate layer on the 2D material underlayer 2 (hBN surface) at the bottoms of the block trench zones 31, and the intermediate layer is used to modulate the epitaxial lattice constant. For example, if three color light components are fabricated on the same wafer, and three sets of block trench zones 31 are made in the aforementioned Step 3, then at least two (which may be two or three) sets of block trench zones 31 grow intermediate layers at the bottoms in step of selecting a zone in Step 4. If only two color light components are fabricated on the same wafer, only two sets of block trench zones in the epitaxial isolation layer 3 are provided, and then the bottoms of the block trench zones 31 corresponding to at least one of the components grows with intermediate layer for modulating the epitaxial lattice constant.

For FIGS. 2 to 5, it is a red, green, and blue LED component fabricated on the same wafer, and the epitaxial isolation layer 3 has three sets of block trench zones 31, then at least two types of components corresponding to the bottoms of the block trench zones 31 grow intermediate layer, and it is shown that there is an intermediate layer growing at the bottoms of the block trench zones 31 corresponding to all three types of components. Here, the intermediate layer may comprise a single type of 2D material, or is a composite layer comprising plural types of 2D materials. Alternatively, the intermediate layer is composed of a bottom layer and a top layer, the bottom layer is composed of a single type of 2D material or is a composite layer composed of plural types of 2D materials, the top layer is coated over the bottom layer, and the top layer is composed of a nitride containing an element such as Al or Ga or In, etc. The 2D materials may also be hBN (hexagonal boron nitride), graphene, and the TMD family (transition metal dithiocarbide), etc. As shown in FIGS. 2 to 5, the block trench zone 31 of the blue light component grows WS2 layer by chemical vapor deposition (CVD) epitaxy on the 2D material underlayer 2 (hBN surface), and then grows GaN by molecular beam epitaxy (MBE), thus constituting the intermediate layer 41 of the blue light zone. The block trench zone 31 of the green light component forms the intermediate layer 42 on the 2D material underlayer 2 as MBE $In_xGa_{1-x}N$/CVD $WSe_2$. The block trench zone 31 of the red light component forms the intermediate layer 43 on the 2D material underlayer 2 as MBE $In_yGa_{1-y}N$/CVD $WSe_2$, where $y>x$.

The 2D material of the intermediate layer grown in the selective zone may be grown by a one-step growth or a one-step deposition process (e.g., CVD or MOCVD, etc.) or a two-step growth, such as depositing a tungsten or molybdenum metal layer and then selenizing or vulcanizing this layer.

The nitride top layer containing elements such as Al or Ga or In used for the intermediate layer for the growth of the selective zone can be deposited by various physical or chemical vapor deposition such as MOCVD process or sputtering or molecular beam epitaxy (MBE), and the thickness can be controlled to be about 20 nm but not limited to this.

Step 5, carrying out the LED epitaxial process in the block trench zones 31 on the same epitaxial wafer 1, to form the epitaxial layer 5, based on the lattice modulation effect of the aforementioned intermediate layers 41, 42, 43, which makes it possible to have consistent parameters such as the temperature of the epitaxial process. The epitaxial processes for fabricating the different color light components on the same wafer can be carried out simultaneously or sequentially. The size of the InGaN LED components for which component fabrication is accomplished on the same epitaxial wafer 1 is in the size range of the micro-LED.

Figure 2:
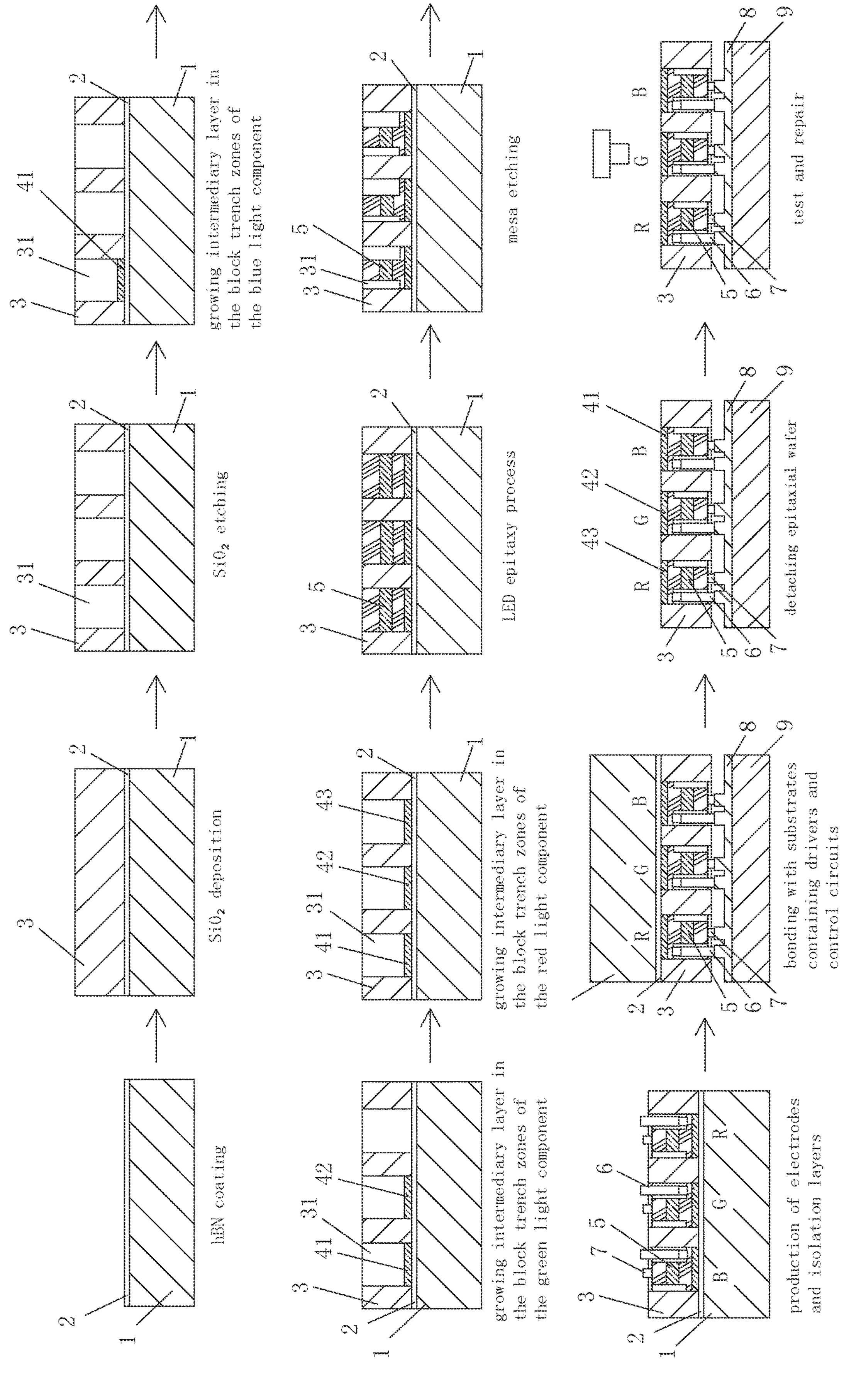
FIG. 2 is a process flow diagram of Embodiment I according to the present disclosure.
Figure 3:
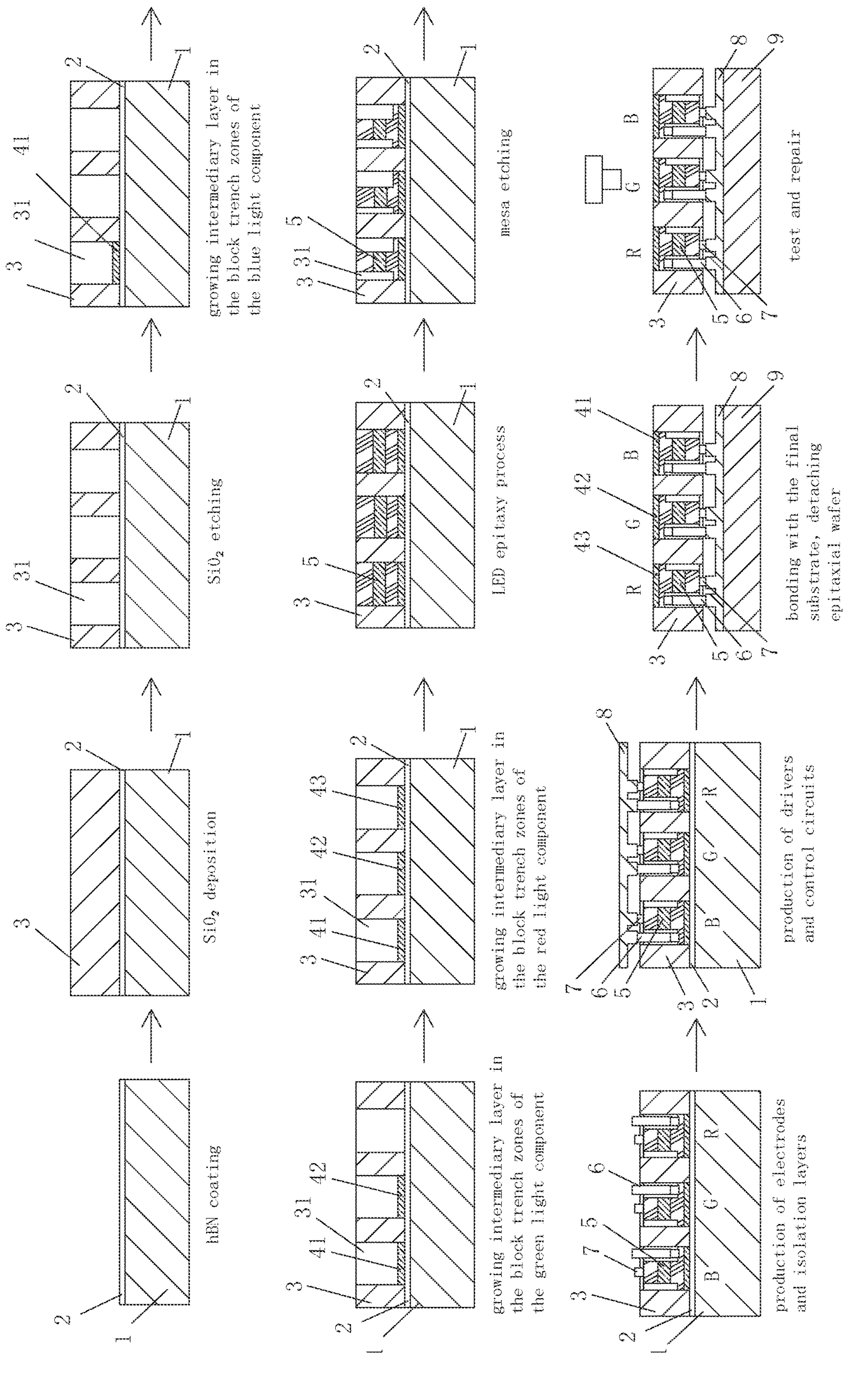
FIG. 3 is a process flow diagram of Embodiment II according to the present disclosure.
Figure 4:
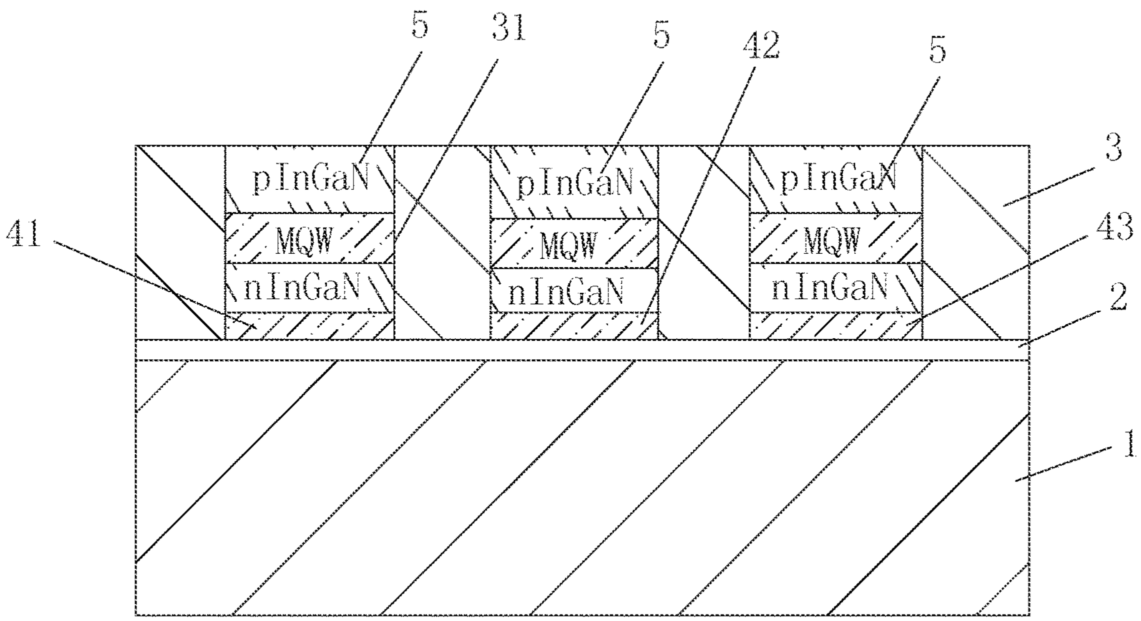
FIG. 4 is a schematic diagram of an RGB InGaN LED assembly according to the present disclosure.
Figure 5:
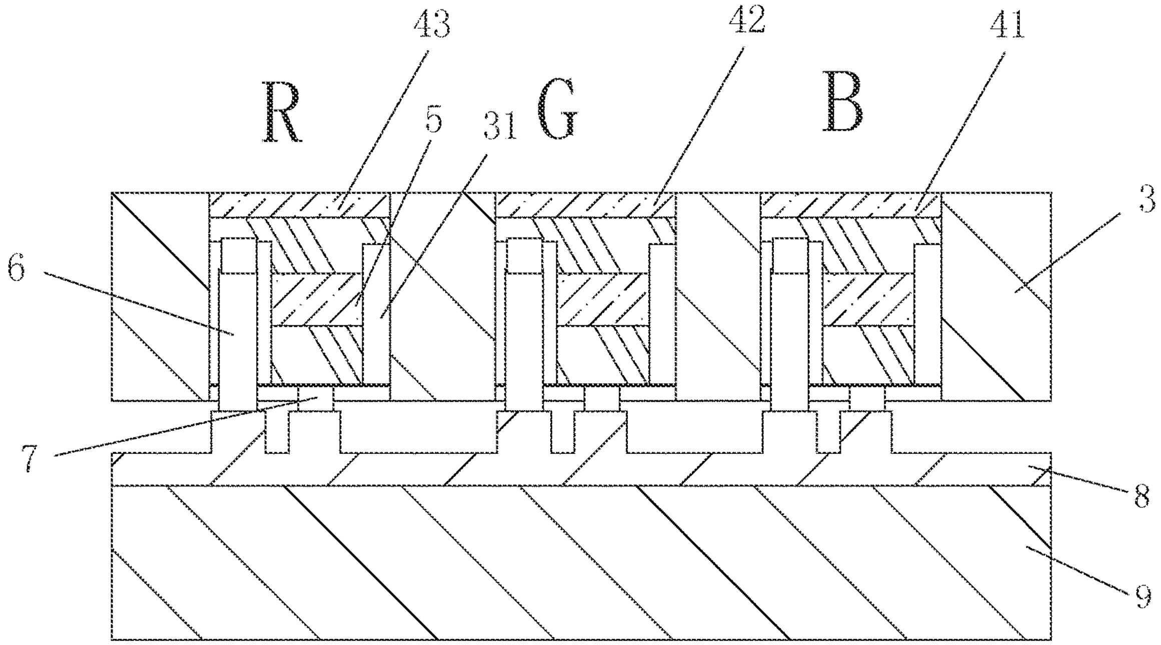
FIG. 5 is a schematic diagram of a product according to the present disclosure.

After the blue-green-red InGaN LED epitaxial layer 5 process is completed, the common LED component completion process can be continued. The typical process includes mesa etching, and the production of electrodes 6, isolation layers, and metal pads 7 and the like. Then, as shown in FIG. 2, the separately produced substrate 9 containing drivers and control circuits 8 is directly connected to the LED component, and then the epitaxial wafer 1 used for the original epitaxy is detached or removed. Alternatively, as shown in FIG. 3, the epitaxial wafer 1 is detached first, and then the LED device is coupled to the drivers and control circuits 8 and the like. The substrate 9 may be a substrate containing a silicon-based CMOS component or a control circuit or a glass substrate on which a TFT is made, or the like. Blue-green-red LED component testing is carried out and redundancy blue-green-red LED component is used for repair (e.g., the use of electronic fuse efuse and other mechanisms to repair). The driver and the control circuit design include a redundancy RGB LED component testing and repair (e.g., efuse, etc.) mechanism.

In this way, the present disclosure completes the production of micro-LED devices. The core functional structure of the RGB InGaN LED three-color components is composed of a nitride semiconductor epitaxial layer, and the active luminescent layer material is InGaN. This method for producing micro-LED displays can eliminate or simplify the mass transfer process.

As shown in FIGS. 2 to 5, the present disclosure produces an RGB InGaN-based micro-LED device, consisting of multiple RGB InGaN LED components. According to the layout design required for the finished product, the three-color light components of the RGB InGaN LED components are formed on the same epitaxial wafer 1. A 2D material underlayer 2 is deposited on the epitaxial wafer 1, then a $SiO_2$ epitaxial isolation layer 3 is deposited on the 2D material underlayer 2 and subsequently etched to form block trench zones 31 for the three-color light components. At the bottom of the block trench zones 31 of the three-color light components, intermediary layers 41, 42, and 43 used to modulate the lattice constant of the epitaxial layers are formed. In the block trench zones 31, corresponding InGaN-based material epitaxial layers 5 for the three-color light components are then grown on the intermediary layers 41, 42, and 43.

According to the layout design required for the finished product, the RGB InGaN LED components form pixels. The layout of RGB InGaN LED components in a single pixel can be designed with multiple sets of RGB InGaN LED components as redundancy, for repairing defective components to improve the yield. This layout design can reserve sufficient space to match the possible configuration of touch components, or various biometric identification components that may be required for the display.

By using the present disclosure, various display or related component products can be produced.

The above description is only the preferred embodiment of the present disclosure and is not intended to limit the scope thereof. It should be noted that equivalent changes made by those skilled in the art in light of the design concepts of the present disclosure after reading this specification all fall within the protection scope of the present disclosure.

What is claimed is:

1. A method for fabricating a red-green-blue (RGB) InGaN-based micro light-emitting diode (micro-LED), used to fabricate a micro-LED device comprising a plurality of RGB InGaN light-emitting diode (LED) components, where two or three color light components of the RGB InGaN LED components are fabricated on a same epitaxial wafer and are distributed according to a specified layout design, the method comprises steps of:

S1, polishing an epitaxial wafer material to an epitaxial growth grade and subjecting to pre-treatment for preparing for subsequent fabrication procedures to obtain an epitaxial wafer;

S2, depositing $SiO_2$ or other oxides or nitrides or carbides having electrical insulation, visible light penetration and amorphous structure on the epitaxial wafer as an isolation layer of an epitaxial zone of a light component of each color;

S3, etching to remove the isolation layer of an LED epitaxial zone corresponding to the two or three color light components on the epitaxial wafer, to form block trench zones;

S4, selecting by zone and growing corresponding intermediate layers on bottoms of the block trench zones for at least one of the two or three color light components to modulate an epitaxial lattice constant;

each of the intermediate layers comprises a bottom layer and a top layer; the bottom layer is composed of a single type of two-dimensional (2D) material or is a composite layer of multiple types of 2D materials, and the top layer is coated onto the bottom layer and consists of a nitride containing Al, Ga, or In elements; and S5, carrying out an LED epitaxy process in the block trench zone.

2. The method for fabricating an RGB InGan-based micro-LED as claimed in claim 1, wherein:

prior to the S2, a 2D material underlayer is grown.

3. The method for fabricating an RGB InGaN-based micro-LED as claimed in claim 2, wherein:

the 2D material underlayer comprises a heterostructure layer or monolayer of heterogeneous materials, with a total thickness ranging from 0.5 nm to 1000 nm.

4. The method for fabricating an RGB InGaN-based micro-LED as claimed in claim 2, wherein:

the 2D material underlayer is applied from outside an effective component usage range at an edge of the epitaxial wafer through bevel coating or backside coating.

5. The method for fabricating an RGB InGaN-based micro-LED as claimed in claim 1, wherein:

in the S4, a 2D material of each of the intermediate layers of a selective zone growth adopts a process of a one-step growth or a one-step deposition process or a two-step growth.

6. The method for fabricating an RGB InGaN-based micro-LED as claimed in claim 1, wherein:

in the S4, a nitride top layer of a selectively grown intermediate layer is deposited using a metalorganic chemical vapor deposition (MOCVD) process or sputtering or molecular beam epitaxy, with a thickness controlled to be 20 nm.

7. The method for fabricating an RGB InGaN-based micro-LED as claimed in claim 1, wherein:

in the S5, epitaxial processes of different color light components of the two or three color light components are configured to be carried out simultaneously or sequentially.

8. The method for fabricating an RGB InGaN-based micro-LED as claimed in claim 1, wherein:

in the specified layout design, pixels are formed by the RGB InGaN LED components, and more than one set of the RGB InGaN LED components in a single pixel in the specified layout design is used as redundancies.

9. The method for fabricating an RGB InGaN-based micro-LED as claimed in claim 1, wherein:

in the specified layout design, pixels are formed by the RGB InGaN LED components, and the specified layout design reserves space to accommodate a potential configuration of touch components, or various biometric identification components that are required for a display.

10. The method for fabricating an RGB InGaN-based micro-LED as claimed in claim 1, wherein:

after the S5, detaching the epitaxial wafer and then coupling to drivers and control circuits, or detaching the epitaxial wafer and directly coupling to a substrate with the drivers and the control circuits manufactured thereon.

11. A red-green-blue (RGB) InGaN-based micro light-emitting diode (micro-LED) device, comprising:

a plurality of RGB InGaN light-emitting diode (LED) components distributed in accordance with a specified layout design, wherein two or three color light components in the RGB InGaN LED components are formed on a same epitaxial wafer; the epitaxial wafer is formed with an isolation layer of an epitaxial zone, and the isolation layer of the epitaxial zone is formed with block trench zones of the two or three color light components, and intermediate layers are grown on bottoms of the block trench zones for at least one of the two or three color light components to modulate an epitaxial lattice constant, and then an epitaxial layer of InGaN-based material corresponding to the two or three color light components are formed in the block trench zones;

a fully coated two-dimensional (2D) material underlayer is further provided between the epitaxial wafer and the isolation layer of the epitaxial zone, and the bottoms of the block trench zones are provided on a top of the fully coated 2D material underlayer.

12. The RGB InGaN-based micro-LED device as claimed in claim 11, wherein:

each of the intermediate layers comprises a bottom layer and a top layer, the bottom layer comprises a single type of 2D material or comprises multiple types of 2D materials to form a composite layer; the top layer is coated on the bottom layer, the top layer is composed of nitride containing Al or Ga or In elements to yield a nitride top layer; and the nitride top layer of each of the intermediate layers is controlled to have a thickness of 20 nm.

13. The RGB InGaN-based micro-LED device as claimed in claim 11, wherein:

the fully coated 2D material underlayer is applied from outside an effective component usage range at an edge of the epitaxial wafer through bevel coating or backside coating.

14. The RGB InGaN-based micro-LED device as claimed in claim 11, wherein:

the epitaxial wafer is formed with the block trench zones of the three color light components on the isolation layer of the epitaxial zone, the bottoms of the block trench zones of the three color light components are formed with the intermediate layers used for modulating the epitaxial lattice constant; a first of the intermediate layers at a bottom of a first of the block trench zones of a blue light component of the three color light components consists of a $WSe_2$ layer and a GaN layer, a second of the intermediate layers at a bottom of a second of the block trench zones of a green light component of the three color light components is composed of an $WSe_2$ layer and an $In_xGa_{1-x}N$ layer, and a third of the intermediate layers at a bottom of a third of the block trench zones of a red light component of the three color light components is composed of a $WSe_2$ layer and an $In_yGa_{1-y}N$ layer, where y>x.

15. A red-green-blue (RGB) InGaN-based micro light-emitting diode (micro-LED) device, comprising:

a plurality of RGB InGaN light-emitting diode (LED) components distributed in accordance with a specified layout design, wherein two or three color light components in the RGB InGaN LED components are formed on a same epitaxial wafer; the epitaxial wafer is formed with an isolation layer of an epitaxial zone, and the isolation layer of the epitaxial zone is formed with block trench zones of the two or three color light components, and intermediate layers are grown on bottoms of the block trench zones for at least one of the two or three color light components to modulate an epitaxial lattice constant, and then an epitaxial layer of InGaN-based material corresponding to the two or three color light components are formed in the block trench zones; and wherein the epitaxial wafer is formed with the block trench zones of the three color light components on the isolation layer of the epitaxial zone, the bottoms of the block trench zones of the three color light components are formed with the intermediate layers used for modulating the epitaxial lattice constant; a first of the intermediate layers at a bottom of a first of the block trench zones of a blue light component of the three color light components consists of a $WSe_2$ layer and a GaN layer, a second of the intermediate layers at a bottom of a second of the block trench zones of a green light component of the three color light components is composed of an $WSe_2$ layer and an $In_xGa_{1-x}N$ layer, and a third of the intermediate layers at a bottom of a third of the block trench zones of a red light component of the three color light components is composed of a $WSe_2$ layer and an $In_yGa_{1-y}N$ layer, where y>x.

* * * * *